(12) United States Patent
Varnica et al.

(10) Patent No.: US 8,887,032 B1
(45) Date of Patent: Nov. 11, 2014

(54) DEFECT DETECTION AND CORRECTION VIA MONITORING OF SYNDROMES AND BIT FLIPS IN DECODER

(71) Applicant: Marvell International Ltd., Hamilton (BM)

(72) Inventors: Nedeljko Varnica, San Jose, CA (US); Gregory Burd, San Jose, CA (US)

(73) Assignee: Marvell International Ltd., Hamilton (BM)

(*) Notice: Subject to any disclaimer, the term of this patent is extended or adjusted under 35 U.S.C. 154(b) by 4 days.

(21) Appl. No.: 13/947,611

(22) Filed: Jul. 22, 2013

Related U.S. Application Data

(63) Continuation of application No. 13/299,616, filed on Nov. 18, 2011, now Pat. No. 8,495,479.

(51) Int. Cl.
*H03M 13/00* (2006.01)
*G06F 11/07* (2006.01)

(52) U.S. Cl.
CPC .................................. *G06F 11/076* (2013.01)
USPC ........................................ 714/780; 714/794

(58) Field of Classification Search
CPC .................... H03M 13/1111; H03M 13/1128; H03M 13/1142; H03M 13/3746; H03M 13/6331
USPC .......................................... 714/780, 794, 769
See application file for complete search history.

(56) References Cited

U.S. PATENT DOCUMENTS

| | | | |
|---|---|---|---|
| 6,021,518 A | 2/2000 | Pelz | |
| 6,061,823 A | 5/2000 | Nara | |
| 6,799,294 B1 | 9/2004 | Chung et al. | |
| 7,502,986 B2 | 3/2009 | O'Neill et al. | |
| 7,526,711 B2 | 4/2009 | Orio | |
| 7,805,664 B1 | 9/2010 | Yang et al. | |
| 7,827,461 B1 | 11/2010 | Low et al. | |
| 7,827,474 B1 | 11/2010 | Sutardja et al. | |
| 7,876,860 B1 | 1/2011 | Varnica et al. | |
| 8,032,812 B1 | 10/2011 | Yang et al. | |
| 8,176,400 B2 | 5/2012 | Tan et al. | |
| 8,190,977 B2 * | 5/2012 | Lunglmayr et al. | 714/780 |
| 8,209,579 B2 | 6/2012 | Belogolovy | |
| 8,407,563 B2 * | 3/2013 | Karabed et al. | 714/769 |
| 8,429,498 B1 * | 4/2013 | Anholt et al. | 714/764 |

* cited by examiner

Primary Examiner — David Ton

(57) ABSTRACT

A system for reading data from a data storage device includes a channel detector configured to detect bits of digital data corresponding to the data read from the storage device, and, for each of the bits of digital data, determine a probability that each of the bits is a 0 or a 1. A decoder module is configured to generate confidence indicators associated with a first subset of the digital data. The confidence indicators include the probability, received from the channel detector, that each of the bits in the first subset of the digital data is a 0 or a 1, and/or bit flip data indicating a number of times each of the bits in the first subset of the digital data was flipped during decoding. A digital defect detection module is configured to selectively identify the first subset of the digital data as defective based on the confidence indicators.

18 Claims, 5 Drawing Sheets

DEFECT DETECTION AND CORRECTION VIA MONITORING OF SYNDROMES AND BIT FLIPS IN DECODER

CROSS-REFERENCE TO RELATED APPLICATIONS

The present disclosure is a continuation of U.S. patent application Ser. No. 13/299,616 (now U.S. Pat. No. 8,495,479), filed on Nov. 18, 2011, which claims the benefit of U.S. Provisional Application No. 61/416,173, filed on Nov. 22, 2010. The disclosures of the above applications are incorporated herein by reference in its entirety.

FIELD

The present disclosure relates to data storage systems, and more particularly to defect detection and correction in a read channel of a storage system.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Data stored in a data storage system such as a hard disk drive (HDD) system or a solid stage drive (SSD) system is typically encoded using an error correction code (ECC). For example, the ECC may include a Reed-Solomon code or a low-density parity check (LDPC) code. The ECC is a known data structure that is inserted into data prior to transmission and/or storage.

The data is read back from the data storage system as a read back signal in a read channel. A channel detector (e.g., a Viterbi detector) detects the read back signal and generates bits or multi-bit symbols based on the read back signal. The data (i.e., the bits or symbols) generated by the channel detector may include errors. For example, detection errors and noise may result in errors in the data. A decoder detects and corrects the errors based on the ECC that is encoded with the data.

SUMMARY

A defect detection and correction system includes a decoder module configured to decode data received from a data storage device and output the data and a plurality of confidence indicators associated with respective bits of the data. A digital defect detection module is configured to compare each of the confidence indicators in a window of W bits of the data to a confidence threshold, identify a number of bits in the window of W bits as defective based on the comparison, mark all of the bits in the window of W bits as defective if the number of bits is greater than a bit threshold, and generate a defect indicator identifying the window of W bits as defective.

In other features, the confidence indicators include at least one of a number of times each bit was flipped during decoding and a log-likelihood ratio (LLR) for each bit. The decoder module includes a low density parity check (LDPC) decoder.

A defect detection and correction method includes decoding data received from a data storage device, outputting the data and a plurality of confidence indicators associated with respective bits of the data, comparing each of the confidence indicators in a window of W bits of the data to a confidence threshold, identifying a number of bits in the window of W bits as defective based on the comparison, marking all of the bits in the window of W bits as defective if the number of bits is greater than a bit threshold, and generating a defect indicator identifying the window of W bits as defective.

In other features, the confidence indicators include at least one of a number of times each bit was flipped during decoding and a log-likelihood ratio (LLR) for each bit. The decoding includes using a low density parity check (LDPC) decoder.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

DESCRIPTION

In a data storage system such as a hard disk drive (HDD) system or a solid stage drive (SSD) system, defect errors are common. The defects typically occur in bursts, or groups of consecutive bits or multi-bit symbols in a sector or codeword. Longer bursts (for example only, bursts of greater than or equal to 48 bits) of defects are easier to detect relative to shorter bursts. Defects of several short bursts (for example only, three short bursts of 16 bits each) in a single sector may be more difficult to detect. However, modifying parameters of the standard defect detectors to increase the probability of detecting such defects also increases the probability of triggering false alarms (i.e., identifying non-defect bits as defects).

The defect detection and correction system according to the present disclosure includes a low density parity check (LDPC) decoder in a read channel of the data storage system. The LDPC decoder decodes data received from a channel detector and detects and corrects defects in the data. A digital defect detection module communicates with an output of the LDPC decoder and performs additional defect detection and correction on the data. While example data storage systems such as an HDD system or an SSD system are provided, the defect detection and correction system of the present disclosure may be applicable to other suitable data storage systems. Further, although the present disclosure describes implementations based on binary code applications, it is to be apparent from the examples within that the principles of the defect detection and correction system can be applied to non-binary data.

Figure 1:
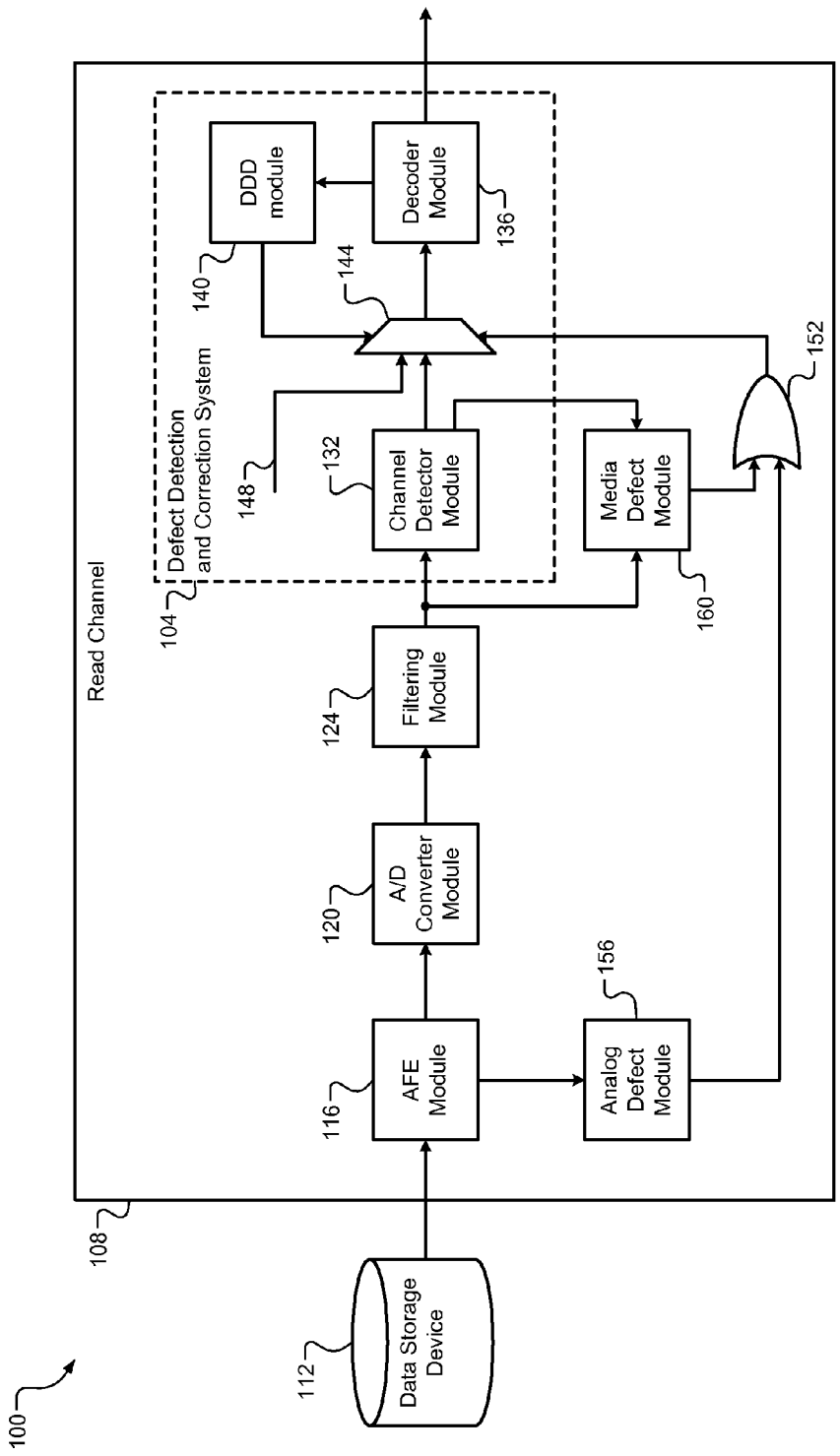
FIG. 1 is an example of a data storage system according to the principles of the present disclosure.

Referring now to FIG. 1, an example of a data storage system 100 implements a defect detection and correction system 104 according to the present disclosure. A read channel 108 reads and processes data stored on a data storage device 112 such as an HDD or an SSD. The read channel 108 may include an analog front end (AFE) module 116, an analog-to-digital (A/D) converter module 120, and a filtering module 124. The AFE module 116 samples and conditions analog data read from the data storage device 112. The A/D converter module 120 converts the analog data to digital data. The filtering module 124, which includes, for example only, a finite input response (FIR) filter, performs filtering on the digital data.

The defect detection and correction system 104 includes a channel detector module 132, a decoder module 136, and a digital defect detection (DDD) module 140. The channel detector module 132 receives the digital data and detects the bits or symbols in the digital data. In other words, for each bit of the digital data, the channel detector module 132 indicates whether the bit is a "0" or a "1." Further, the channel detector module 132 may provide a confidence indicator (i.e., a reliability indicator) associated with each of the bits. The confidence indicator may indicate a probability of the detected bit being either a "0" or a "1." For example, if the channel detector module 132 implements hard detection (and, correspondingly, the decoder module 136 implements hard decoding) the channel detector module 132 may only indicate whether a bit is a "0" or a "1."

Conversely, if the channel detector module 132 implements soft detection (and, correspondingly, the decoder module 136 implements soft decoding) such as a soft output Viterbi algorithm (SOVA), the channel detector module 132 may also provide the confidence indicator for each bit. For example only, the channel detector module 132 may provide a log-likelihood ratio (LLR) associated with each bit. An example of a soft detector that provides the LLR is described in U.S. Pat. No. 7,876,860, which is hereby incorporated within in its entirety. For example only, the channel detector module 132 may also provide erasure information. An example of a channel detector that provides erasure information is described in U.S. Pat. No. 8,032,812, which is hereby incorporated within in its entirety.

The decoder module 136 outputs data based on the detected bits output by the channel detector module 132. The decoder module 136 may output the data when a number of errors in the bits (or symbols) in the data is assumed to be zero. For example, the decoder module 136 may be a low-density parity-check (LDPC) decoder as described in U.S. Pat. No. 7,827,461, which is hereby incorporated within in its entirety. In LDPC decoding, syndrome values (e.g., 0 for a satisfied check and 1 for an unsatisfied check) may be calculated. A number of unsatisfied checks (i.e., 1s) in given region of LDPC nodes corresponds to a syndrome weight. Accordingly, the syndrome weight may be compared to zero. If the syndrome weight is zero, the decoder module 136 may output the data. Conversely, the decoder module 136 may indicate a failure if the syndrome weight is greater than zero, i.e. if the decoder module 136 is simply unable to decode the data. For example, if a failure is detected, the decoder module 136 may initiate a retry mode. In the retry mode, the decoder module 136 may repeatedly attempt to decode and correct any errors in the data. The decoder module 136 may consider the syndrome weight after only one decoding iteration or after a predetermined number of decoding iterations.

The decoder module 136 also provides the decoded data and/or associated confidence indicators to the DDD module 140 in the retry mode. For example, in addition to or instead of any confidence indicators (e.g., LLR) provided by the channel detector module 132, the decoder module 136 may generate confidence indicators for the data. For example, during decoding, the decoder module 136 may flip one or more bits of the data. In other words, a bit that is received from the channel detector module 132 may have a value of "0" before decoding and a value of "1" after decoding. Or, the bit may still have a value of "0" after decoding, but may have been flipped from "0" to "1" and back to "0" one or more times during decoding. The decoder module 136 may generate and/or store bit flip data that is indicative of the number of times each bit was flipped during decoding.

In one implementation, the decoder module 136 provides the decoded data and the confidence indicators (e.g., one or both of the LLRs and the bit flip data) to the DDD module 140. In another implementation, the decoder module 136 may only provide decoded data that corresponds to a window of data that meets one or more criteria (e.g., a window of data having a certain syndrome property as described below).

One confidence indicator (i.e., the bit flip data as described above) generated by the decoder module 136 may be associated with the number of bits flipped during decoding. For example, a relatively low number of bits flipped during decoding indicates a high confidence in the decisions of the decoder module 136 for those bits. Conversely, a relatively high number of bits flipped during decoding indicates a low confidence in the decisions of the decoder module 136 for those bits. Similarly, a high LLR indicates a high confidence and a low LLR indicates a low confidence. Although not shown, the system 100 may include a de-interleaver that de-interleaves the data if the data is interleaved between the channel detector module 132 and the decoder module 136.

The DDD module 140 generates a defect indicator based on the data and the confidence indicators received from the decoder module 136. For example, the DDD module 140 examines each window of W bits of the data. For example only, W may correspond to a predetermined calibratable (e.g., adjustable) window size, or may be an adjustable or programmable value stored in a register. If a number of the W bits that meet certain criteria is greater than or equal to a bit threshold of $N_W$ bits, then the DDD module 140 marks the entire window of W (e.g., an integer greater than one) bits as a defect (i.e., a window in which a defect has been detected). Individual bits that meet the criteria may be marked (e.g., marked as defective). In some implementations, W may be one. Typically, W is greater than 1. After a given window is examined, the DDD module 140 may slide the window by L bits (i.e., a window step) and examine a following (i.e., sequentially subsequent) window. For example, if the window of W bits includes bits $b_0$ through $b_{W-1}$, the DDD module 140 may increment the window by a window step of one bit and examine a window of bits $b_1$ through $b_W$. The DDD module 140 may increment the window by a step of one bit or more than one bit.

For example, if the bits in a window connect to a certain number of non-zero syndrome locations (e.g. the number of unsatisfied parity check locations connected to bits in the window is between first and second thresholds), the DDD module 140 examines the W bits of the window to determine whether to mark the window as a defect. The DDD module 140 determines whether to mark the window as a defect based on the confidence indicators associated with the window. Specifically, the DDD module 140 may mark the window as a defect if a number of bits having a confidence indicator above (or below, depending on the implementation) a confidence threshold is greater than $N_W$. For example, if LLRs are used, the confidence threshold may be an absolute LLR value between 0 and some non-zero magnitude denoted by THR_LLR. In one embodiment, if the number of bits in the part of the window determined by unsatisfied parity checks (as above) having an LLR value greater than the confidence threshold is greater than $N_W$, then the DDD module 140 marks the entire window as a defect. In another embodiment, if the number of unsatisfied parity check locations connected to the bits in the window is between first and second thresholds and if the number of bits in the entire window having an LLR value greater than the confidence threshold is greater than $N_W$, then the DDD module 140 marks the entire window as a defect. In yet another embodiment, the system 104 may not consider unsatisfied parity checks associated with a window, and instead examines windows based merely on the confidence indicators.

If multiple decoding iterations are performed, the LLR for each bit may represent an accumulative value for the multiple iterations. In other words, for each bit the corresponding LLR may be a sum of all LLRs for that bit over multiple iterations. For example, a given bit may be marked as defective if $$\text{abs}\left(\sum_1^I LLR(i)\right) > \text{THR\_LLR}$$

for iterations 1 through I, where LLR(i) is the LLR for a bit i and THR_LLR is the LLR confidence threshold. A bit i may be marked as defective by setting a value DefB(i)=1. If the bit i is not defective, the value is set to DefB(i)=0. If the number of bits marked as defective in the window W is greater than $N_W$, then the entire window W is marked as defective. In other words, the system 104 may determine a sum for all bits DefB(i) over the entire window W (or the part of the window W containing bits connected to unsatisfied checks), and determine whether the sum is greater than $N_W$. For example, the entire window W may be marked as defective if $$\sum_{i=k}^{k+W-1} DefB(i) > N_W,$$

where k is a bit position of a first bit in the window W.

In other implementations, the system 104 may mark an entire window W as defective based on an aggregate LLR threshold for all bits in the window instead of, or in addition to, a number of bits exceeding an LLR threshold. For example, over I iterations, a total LLR for a bit i, or $LLR_B(i)$, corresponds to $$\text{abs}\left(\sum_1^I LLR(i)\right).$$

The sum of all $LLR_B(i)$ for the window W (or the part of the window containing bits connected to unsatisfied checks) is compared to an aggregate LLR threshold THR_LLR. For example, if $$\sum_{i=k}^{k+W-1} LLR_B(i) > \text{THR\_LLR},$$

then the entire window W is marked as defective.

Conversely, if bit flips are used, the confidence threshold may be a number of flips for each bit. For example only, the number of flips may be a programmable number of flips F. If the number of bits in the window (or the part of the window containing bits connected to unsatisfied checks) that flipped less than the confidence threshold (e.g., F) is greater than $N_W$, then the DDD module 140 marks the entire window as a defect. The number of bit flips can be based on a single decoding or a predetermined number of decoding iterations I. Accordingly, whether LLRs or bit flips are used, the DDD module 140 examines each window having unsatisfied parity checks for a relatively high confidence (i.e., a high LLR or a low number of bit flips). For example, a high LLR indicates a high confidence in the value of the bit. Similarly, a low number of bit flips indicates a high confidence in the value of the bit. In this manner, the DDD module 140 marks windows having unsatisfied parity checks yet a high confidence (e.g., a number of W bits having high confidence being greater than $N_W$) as defects. This can result in detection of severe (deep) defects even if they are represented in short bursts. In some implementations, both the bit flip data and the LLRs may be used to indicate defects.

A multiplexer 144 receives the defect indicator from the DDD module 140 for each window as a selection signal. The multiplexer 144 selects between the data received from the channel detector module 132 and a replacement data 148 based on the defect indicator. If the defect indicator indicates that a window is defective, the multiplexer 144 selects the replacement data 148 for each bit in the window. For example only, if the channel detector module 132 is a soft detector that output LLRs, the replacement data 148 may replace all of the LLRs for the window with 0. In other implementations, the replacement data 148 may include erasure information. Accordingly, in case of a defect, the multiplexer 144 outputs the replacement data 148 to the decoder module 136. In response to the replacement data 148, the decoder module 136 may determine that the corresponding data is defective or erased and needs to be repaired.

The DDD module 140 operates on the data received from the decoder module 136 in the retry mode. In other implementations, the DDD module 140 may continuously operate on the data outside of the retry mode.

The multiplexer 144 may also select the replacement data 148 based on an output of an OR gate 152, which communicates with an analog defect module 156 and a media defect module 160. The analog defect module 156 may detect defects in the analog data received from the data storage device 112. The media defect module 160 may defect media defects associated with the data.

If iterative soft detecting and/or decoding are implemented, the defect detection and correction system 104 may mask defects that are found in the data prior to decoding. For example only, the system 104 may erase defective bits and/or adjust an amplitude of defective bits. To erase defective bits, the LLRs for the bits may be adjusted to a value that indicates erasure (e.g., zero). To adjust the amplitudes of defective bits, the amplitudes may be scaled downward by a predetermined factor S (where S is, for example only, 0.25 or 0.5). Alternatively, the amplitudes may be limited to a predetermined maximum value M. For example, if a given amplitude is greater than M, the amplitude is limited to M. If the amplitude is less than M, then the amplitude retains its value. In subsequent decoding iterations, the same values may be used for the predetermined factor S and the maximum value M, or the values may be adjusted between each iteration.

The system 104 may detect and repair stopping sets in the data. A stopping set corresponds to a set of bits that is identified as being unable to be decoded. For example, after the DDD module 140 completes defect detection on an entire sector (or, codeword) of data, the decoder module 136 and/or the DDD module 140 may determine whether bits marked as defective form a stopping set. If the marked bits do not form a stopping set, the bits remain marked. If the marked bits do form a stopping set, bits may be iteratively removed from the marked bits until the marked bits no longer form a stopping set.

The system 104 may determine whether a set of bits is a stopping set using any suitable method. For example only, for a given set of bits, LLRs greater than the confidence threshold may be provided to all nodes (e.g., bit or symbol nodes) other than nodes already marked as having defects. This scenario corresponds to an all-zero codeword. If the decoder module 136 is able to correct erased bits in the codeword (i.e., produce bits having non-zero LLRs in the erased locations), then the set of bits is determined to not be a stopping set. Conversely, if the decoder module 126 is not able to correct all of the erased bits (i.e., some of the LLRs associated with the bits are still zero), then the set of bits is determined to be a stopping set.

Figure 2:
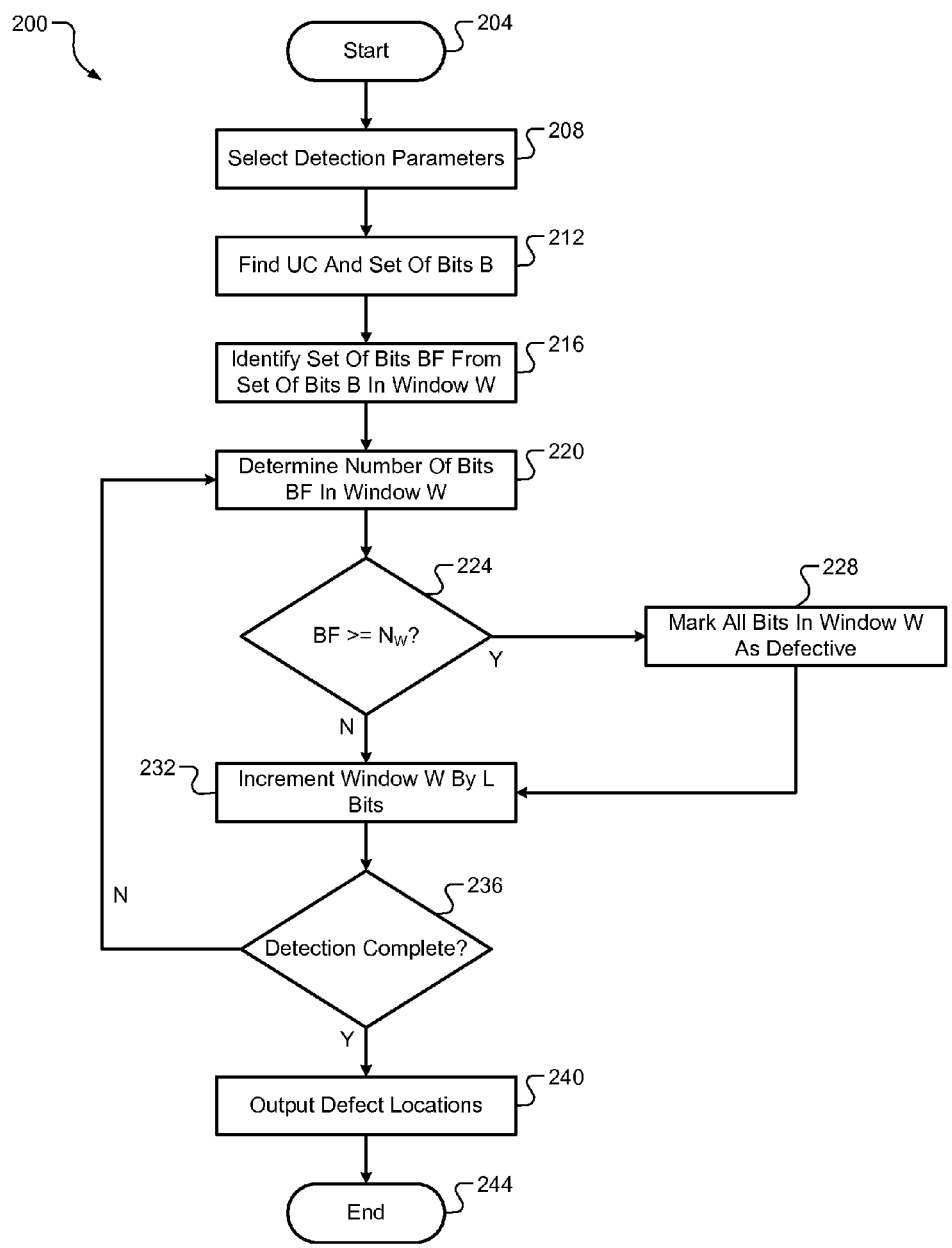
FIG. 2 illustrates an example of a bit flip defect detection method according to the principles of the present disclosure.

Referring now to FIG. 2, an example of a bit flip defect detection method 200 (e.g., as implemented by the defect detection and correction system 104) begins at 204. At 208, the method 200 selects detection parameters. For example, the detection parameters may include, but are not limited to, a window size W, a window step (i.e. the number of bits the window increments) L, a bit flip threshold THR_FLIP, a threshold $N_W$ for the number of bits meeting the defect criteria, and a bit position k that indicates a start position of the window W. At 212, the method 200 performs I decoding iterations to find a set UC of unsatisfied parity checks and a set of bits B connected to the set UC.

At 216, the method 200 identifies a set of bits BF as the bits in the set B that have not been flipped a number of times greater than the threshold THR_FLIP. At 220, the method 200 determines a number of bits in the window k to k+W−1 that are in the set BF. At 224, the method 200 determines whether the number of bits in the set BF is greater than or equal to $N_W$. If true, the method 200 continues to 228. If false, the method 200 continues to 232. At 228, the method 200 marks all bit locations from k to k+W−1 in the window W as defective. At 232, the method 200 increments k by L bits (e.g., sets k=k+L). At 236, the method 200 determines whether defect detection is complete for a given codeword or sector. If true, the method 200 outputs the defect locations for that codeword or sector at 240. If false, the method 200 continues to 220. The method 200 ends at 244.

Figure 3:
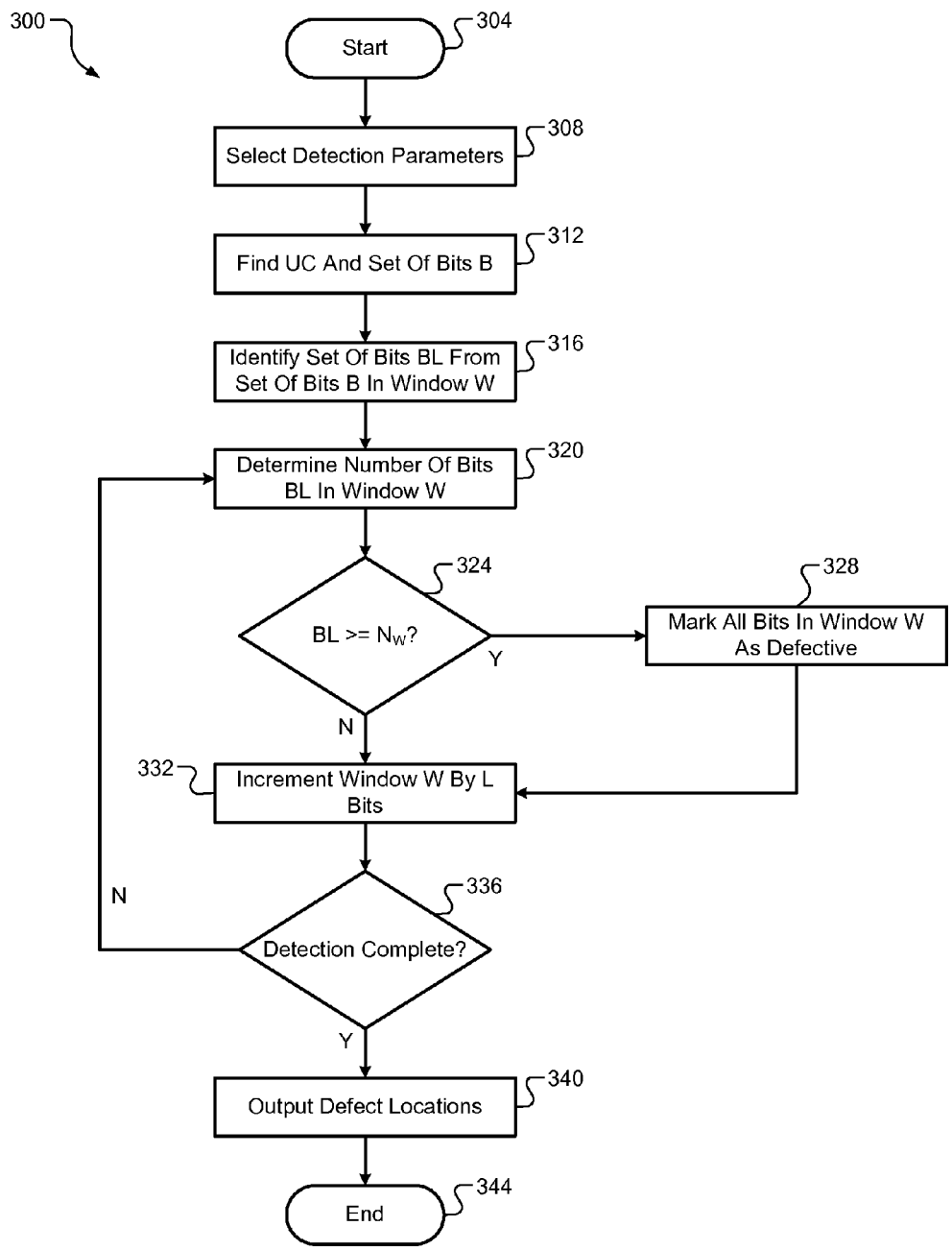
FIG. 3 illustrates an example of a log-likelihood ratio (LLR) defect detection method according to the principles of the present disclosure.

Referring now to FIG. 3, an example of an LLR defect detection method 300 (e.g., as implemented by the defect detection and correction system 104) begins at 304. At 308, the method 300 selects detection parameters. For example, the detection parameters may include, but are not limited to, a window size W, a window step (i.e. the number of bits the window increments) L, an LLR threshold THR_LLR, a threshold $N_W$ for the number of bits meeting the defect criteria, and a bit position k that indicates a start position of the window W. At 312, the method 300 performs I decoding iterations to find a set UC of unsatisfied parity checks and a set of bits B connected to the set UC.

At 316, the method 300 identifies a set of bits BL as the bits in the set B that have an LLR greater than the threshold THR_LLR. At 320, the method 300 determines a number of bits in the window k to k+W−1 that are in the set BL. At 324, the method 300 determines whether the number of bits in the set BL is greater than or equal to $N_W$. If true, the method 300 continues to 328. If false, the method 300 continues to 332. At 328, the method 300 marks all bit locations from k to k+W−1 in the window W as defective. At 332, the method 300 increments k by L bits (e.g., sets k=k+L). At 336, the method 300 determines whether defect detection is complete for a given codeword or sector. If true, the method 300 outputs the defect locations for that codeword or sector at 340. If false, the method 300 continues to 320. The method 300 ends at 344.

Figure 4:
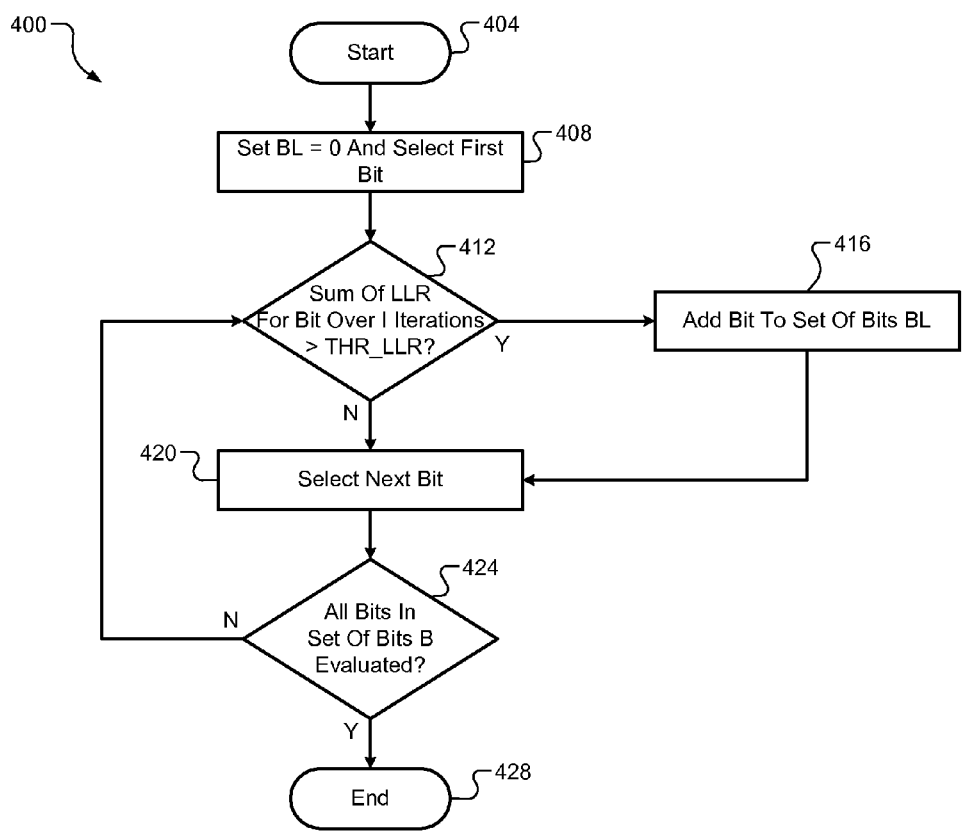
FIG. 4 illustrates an example of an LLR bit defect determination method according to the principles of the present disclosure.

Referring now to FIG. 4, an example of an LLR bit defect determination method 400 begins at 404. For example, the method 400 may identify the set of bits BL as described at 316 of FIG. 3. At 408, the method 400 sets BL=0 and selects a first bit i of the set of bits B. At 412, the method 400 determines whether $$\text{abs}\left(\sum_{1}^{i} LLR(i)\right) > \text{THR\_LLR}$$

for the bit i. If true, the method 400 continues to 416. If false, the method 400 continues to 420. At 416, the method 400 adds the bit i to the set of bits BL. At 420, the method 400 selects the next bit i in the set of bits B. At 424, the method 400 determines whether all bits in the set of bits B have been evaluated. If true, the method 400 ends at 428. If false, the method 400 continues to 412.

Figure 5:
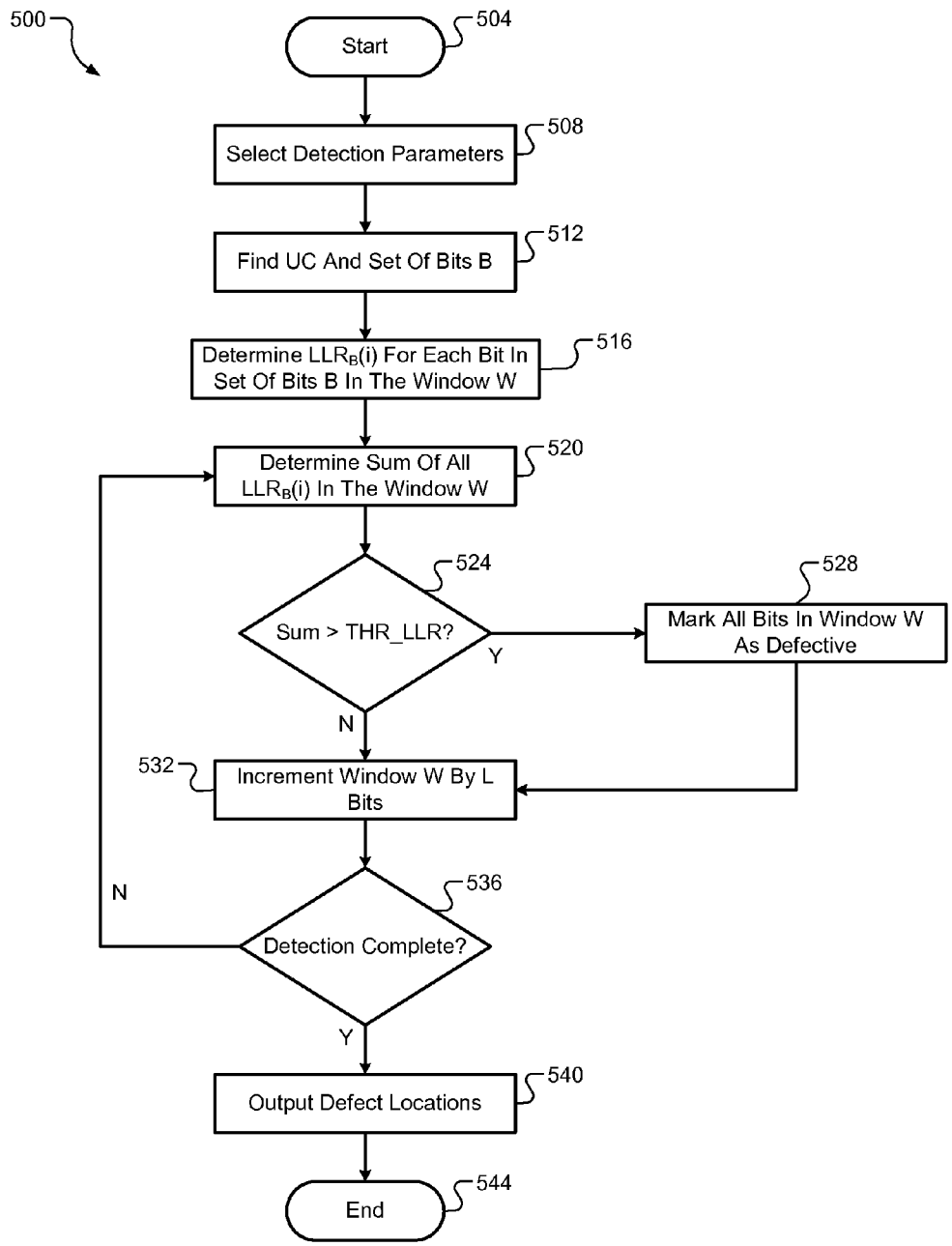
FIG. 5 illustrates another example of an LLR defect detection method according to the principles of the present disclosure.

Referring now to FIG. 5, another example of an LLR defect detection method 500 (e.g., as implemented by the defect detection and correction system 104) begins at 504. For example, the method 500 performs defect detection according to an aggregate LLR threshold as described above in FIG. 1. In other words, instead of determining an absolute LLR value for a given bit to determine whether to add the bit to the set of bits BL, the method 500 determines a total LLR value for all of the bits in a given window. At 508, the method 500 selects detection parameters. For example, the detection parameters may include, but are not limited to, a window size W, a window step (i.e. the number of bits the window increments) L, an aggregate LLR threshold THR_LLR, a threshold $N_W$ for the number of bits meeting the defect criteria, and a bit position k that indicates a start position of the window W. At 512, the method 500 performs I decoding iterations to find a set UC of unsatisfied parity checks and a set of bits B connected to the set UC.

At 516, the method 500 determines a total LLR, or $LLR_B$(i), for each bit in the set B over I decoder iterations. At 520, the method 500 determines a sum of $LLR_B$(i) for all of the bits belonging to the set B and to the window k to k+W−1. At 524, the method 500 determines whether the sum is greater than THR_LLR. If true, the method 500 continues to 528. If false, the method 500 continues to 532. At 528, the method 500 marks all bit locations from k to k+W−1 in the window W as defective. At 532, the method 500 increments k by L bits (e.g., sets k=k+L). At 536, the method 500 determines whether defect detection is complete for a given codeword or sector. If true, the method 500 outputs the defect locations for that codeword or sector at 540. If false, the method 500 continues to 520. The method 500 ends at 544.

In the description with above referenced Figures, we illustrated the embodiment in which the set of unsatisfied checks (UC) is used. This set is used to generate the set of bits B. Subsequently, the set of bits B is used to determine sets BL and BF, for example. This described embodiment is most effective against severe and/or short defects.

In another embodiment, the system 104 may concentrate on long and mild defects, and may not utilize the unsatisfied checks. Accordingly, the set B may be the set of all bits in the LDPC decoder. In such an implementation, the system 104 may also consider low confidence bits (as opposed to high confidence bits). The inequality should change accordingly in such embodiment. For example, a low absolute LLR indicates a low confidence in the value of the bit. Similarly, a high number of bit flips indicates a low confidence in the value of the bit. As an example, in FIG. 4, the relationship in the block 412 would change from ">THR_LLR" to "<THR_LLR". Similarly, in FIG. 5, the relationship in the block 524 would change from "Sum>THR_LLR" to "Sum<THR_LLR".

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

As used herein, the term module may refer to, be part of, or include an Application Specific Integrated Circuit (ASIC); an electronic circuit; a combinational logic circuit; a field programmable gate array (FPGA); a processor (shared, dedicated, or group) that executes code; other suitable hardware components that provide the described functionality; or a combination of some or all of the above, such as in a system-on-chip. The term module may include memory (shared, dedicated, or group) that stores code executed by the processor.

The term code, as used above, may include software, firmware, and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

The apparatuses and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

What is claimed is:

1. A system for reading data from a data storage device, the system comprising:
    a channel detector configured to
        detect bits of digital data corresponding to the data read from the storage device, and
        for each of the bits of digital data, determine a probability value, wherein the probability value indicates a probability that each of the bits is a 0 or a 1;
    a decoder module configured to generate confidence indicators associated with a first subset of the digital data, wherein the confidence indicators include at least one of:
        the probability value received from the channel detector; and
        bit flip data, wherein the bit flip data indicates a number of times each of the bits in the first subset of the digital data was flipped during decoding; and
    a digital defect detection module configured to i) receive the confidence indicators from the decoder module, and ii) selectively identify the first subset of the digital data as defective based on the confidence indicators received from the decoder module.

2. The system of claim 1, wherein the digital defect detection module is configured to:
    determine at least one of:
        i) a first number of bits of the first subset of the digital data that have a probability value greater than a first confidence threshold; and
        ii) a second number of bits of the first subset of the digital data that were flipped during decoding a number of times less than a second confidence threshold; and
    identify the first subset of the digital data as defective if at least one of:
        i) the first number of bits is greater than the first confidence threshold; and
        ii) the second number of bits is less than the second confidence threshold.

3. The system of claim 1, wherein the probability that each of the bits is a 0 or a 1 includes a log-likelihood ratio.

4. The system of claim 1, wherein the first subset of the digital data includes a first window of a plurality of bits.

5. The system of claim 1, wherein the decoder module comprises a low-density parity-check decoder.

6. The system of claim 1, wherein the decoder module is configured to generate the confidence indicators of the first subset of the digital data based on a syndrome weight of the first subset of the digital data.

7. The system of claim 1, wherein a number of bits in the first subset of the digital data is adjustable.

8. The system of claim 1, wherein the decoder module is configured to generate confidence indicators associated with a second subset of the digital data, wherein the second subset of the digital data includes at least one bit in the first subset of the digital data.

9. The system of claim 8, wherein the second subset of the digital data is offset from the first subset of the digital data by one bit.

10. A method for detecting defects in data read from a data storage device, the method comprising:
    detecting bits of digital data corresponding to the data read from the storage device;
    for each of the bits of digital data, determine a probability value, wherein the probability value indicates a probability that each of the bits is a 0 or a 1;
    using a decoder, generating confidence indicators associated with a first subset of the digital data, wherein the confidence indicators include at least one of:
        the probability value; and
        bit flip data, wherein the bit flip data indicates a number of times each of the bits in the first subset of the digital data was flipped during decoding; and
    using a digital defect detector separate from the decoder, i) receiving the confidence indicators from the decoder, and selectively identifying the first subset of the digital data as defective based on the confidence indicators received from the decoder.

11. The method of claim 10, further comprising:
determining at least one of:
   i) a first number of bits of the first subset of the digital data that have a probability value greater than a first confidence threshold; and
   ii) a second number of bits of the first subset of the digital data that were flipped during decoding a number of times less than a second confidence threshold; and
identifying the first subset of the digital data as defective if at least one of:
   i) the first number of bits is greater than the first confidence threshold; and
   ii) the second number of bits is less than the second confidence threshold.

12. The method of claim 10, wherein the probability that each of the bits is a 0 or a 1 includes a log-likelihood ratio.

13. The method of claim 10, wherein the first subset of the digital data includes a first window of a plurality of bits.

14. The method of claim 10, wherein generating the confidence indicators associated with a first subset of the digital data comprises using a low-density parity-check decoder to generate the confidence indicators.

15. The method of claim 10, wherein generating the confidence indicators associated with a first subset of the digital data comprises generating the confidence indicators based on a syndrome weight of the first subset of the digital data.

16. The method of claim 10, wherein a number of bits in the first subset of the digital data is adjustable.

17. The method of claim 10, further comprising generating confidence indicators associated with a second subset of the digital data, wherein the second subset of the digital data includes at least one bit in the first subset of the digital data.

18. The method of claim 17, wherein the second subset of the digital data is offset from the first subset of the digital data by one bit.

* * * * *